(12) United States Patent
Hayashi (10) Patent No.: US 7,629,581 B2
(45) Date of Patent: Dec. 8, 2009

(54) INFRARED SENSOR AND METHOD OF PRODUCING THE SAME

(75) Inventor: Koji Hayashi, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/624,953

(22) Filed: Jan. 19, 2007

(65) Prior Publication Data

US 2007/0114415 A1 May 24, 2007

Related U.S. Application Data

(63) Continuation of application No. PCT/JP2005/013318, filed on Jul. 20, 2005.

(30) Foreign Application Priority Data

Jul. 20, 2004 (JP) ............................. 2004-211838

(51) Int. Cl.
*G01J 5/10* (2006.01)
(52) U.S. Cl. .................................. 250/338.3
(58) Field of Classification Search ............... 250/338.3
See application file for complete search history.

(56) References Cited

U.S. PATENT DOCUMENTS

| | | | | |
|---|---|---|---|---|
| 3,590,327 A | * | 6/1971 | Thomae | 361/679 |
| 4,214,165 A | * | 7/1980 | Asawa | 250/338.3 |
| 4,265,968 A | * | 5/1981 | Prewo | 428/336 |
| 4,489,238 A | * | 12/1984 | Baker | 250/338.3 |
| 5,270,555 A | * | 12/1993 | Ito et al. | 257/81 |
| 5,420,426 A | | 5/1995 | Inoue | |
| 6,476,767 B2 | * | 11/2002 | Aoyama et al. | 343/700 MS |

FOREIGN PATENT DOCUMENTS

| | | |
|---|---|---|
| EP | 0 736 911 A2 | 10/1996 |
| JP | 58-182522 A | 10/1983 |
| JP | 2-52128 U | 4/1990 |
| JP | 04-257279 A | 9/1992 |
| JP | 05-079908 A | 3/1993 |
| JP | 07-335999 A | 12/1995 |
| JP | 08-035880 A | 2/1996 |
| JP | 08-278196 A | 10/1996 |
| JP | 09-184756 A | 7/1997 |
| JP | 3209034 B | 9/2001 |
| JP | 2003-133603 A | 5/2003 |

OTHER PUBLICATIONS

Translation of Japanese Published Unexamined Patent Application (A) No.04-257279.*
Official Communication for PCT Application No. PCT/JP2005/013318; mailed on Nov. 1, 2005.

* cited by examiner

*Primary Examiner*—Shun Lee
(74) *Attorney, Agent, or Firm*—Keating & Bennett, LLP (57) ABSTRACT

A method of producing an infrared sensor includes the steps of preparing a base integrally provided with a first electrode, and a plurality of supporting portions made of a material with low thermal conductivity, on one of principal surfaces of the base, preparing a pyroelectric element which has a second electrode conductively connected to the first electrode on one of principal surfaces of the pyroelectric element, applying a predetermined amount of conductive paste on the first electrode so as to be higher than the supporting portions, and mounting the pyroelectric element on upper surfaces of the supporting portions so that the second electrode comes into contact with the conductive paste, and then curing the conductive paste.

7 Claims, 5 Drawing Sheets

INFRARED SENSOR AND METHOD OF PRODUCING THE SAME

BACKGROUND OF THE INVENTION

1. Field of the Invention

The present invention relates to an infrared sensor and a method of producing the same. More particularly, the present invention relates to a small infrared sensor and a method of producing the same.

2. Description of the Related Art

Generally, an infrared sensor detects intrusion of a person, fire, and other subjects, by utilizing a pyroelectric effect provided by a pyroelectric element mounted in the sensor. The pyroelectric effect is a phenomenon that involves variations in temperature of the pyroelectric element occurring when infrared emitted from a person, fire, or other subjects, enters the pyroelectric element. The variation in temperature modifies spontaneous polarization of the pyroelectric element, and electric charge is generated corresponding to an amount of modification of the spontaneous polarization.

Output of the pyroelectric element varies corresponding to the quantity of electric charge generated due to the modification of the spontaneous polarization of the pyroelectric element. The infrared sensor processes the variation of the output with a circuit to detect a subject.

An infrared sensor of this kind includes supporting portions disposed between a base and the pyroelectric element at both ends or four corners of the pyroelectric element so that the pyroelectric element is spaced from the base by a predetermined distance (Japanese Unexamined Patent Application Publication No. 8-35880 (Patent Document 1)).

In this type of infrared sensor, heat flow may vary in the vicinity of an electrode provided at the pyroelectric element if positions of the pyroelectric element and the supporting portions, or positions of the supporting portions and the base are deviated. When infrared enters the pyroelectric element, a temperature of the pyroelectric element may vary due to the variation of the heat flow, and thus, the output of the pyroelectric element may not be constant with respect to the amount of incident infrared.

To address this problem, a method of producing an infrared sensor is disclosed in Japanese Patent No. 3209034 (Patent Document 2) which includes the steps of printing a conductive paste at both ends of a back surface of the pyroelectric element by screen printing and solidifying the conductive paste to provide supporting portions.

In Patent Document 2, to increase the height of the supporting portions, the printing and solidification are repeated several times to increase the thickness of the supporting portions.

However, the screen printing may cause unevenness of the printed surface instead of a flat surface. If the printing is repeated on the primarily formed, uneven printed surface, the height of the finally produced supporting portions may be uneven depending on the type of sensor to be produced. Accordingly, the dimension of a space (gap) between the pyroelectric element and the base may be uneven.

Heat generated at the pyroelectric element is also transmitted to the space. If the dimension of the space is uneven, the correlation between temperature variation of the space and that of the pyroelectric element may be distorted. In addition, since the temperature change of the space affects the temperature change of the pyroelectric element, the detection accuracy of the sensor may be unstable.

During screen printing, a squeegee presses and slides on the screen to apply a paste previously provided on the screen onto the pyroelectric element through a mesh. It is difficult to supply a specific amount of paste. Also, blurring may occur at a portion between the screen and the pyroelectric element. As a result, the printed pattern may have larger area than desired. If the area of upper surfaces of the supporting portions increases, a contact area with respect to the pyroelectric element increases. The increase in the contact area may cause heat conductivity to be uneven between the pyroelectric element and the supporting portions, and the detection accuracy of the sensor may be unstable.

The above-mentioned problems regarding heat increase as the size of the infrared sensor decreases. Since the conventional infrared sensor has been typically mounted on a relatively large product, such as an intrusion detector or a fire detector, the miniaturization of the sensor has not previously been highly desirable. However, in recent years, the sensor is desired to be mounted in a small product such as wireless equipment. Thus, the size of the infrared sensor must be further decreased. As the miniaturization continues, the dimension of the space between the base and the pyroelectric element, and slight variation of a bonded area of the supporting portions with respect to the pyroelectric element may seriously affect the detection accuracy.

SUMMARY OF THE INVENTION

To overcome the problems described above, preferred embodiments of the present invention provide a small infrared sensor with high detection accuracy, and a method of producing the same.

A method of producing an infrared sensor according to a preferred embodiment of the present invention includes the steps of preparing a base that is integrally provided with a first electrode, and a plurality of supporting portions made of a material having low thermal conductivity and having a predetermined height, the first electrode and the supporting portions being provided on one of principal surfaces of the base; applying a predetermined amount of conductive paste on the first electrode to be higher than the supporting portions; and mounting a pyroelectric element which has a second electrode on one of principal surfaces of the pyroelectric element, on upper surfaces of the supporting portions so that the second electrode comes into contact with the conductive paste, and then curing the conductive paste.

An infrared sensor according to another preferred embodiment of the present invention includes a base in which a first electrode and a plurality of supporting portions having a predetermined height are provided on one of principal surfaces of the base, and a pyroelectric element mounted on upper surfaces of the supporting portions, in which the supporting portions are made of a material with low thermal conductivity, and integrally provided with the base, a second electrode is provided on one of principal surfaces of the pyroelectric element, the second electrode opposes the first electrode, and is conductively connected to the first electrode via a predetermined amount of cured conductive paste.

In the infrared sensor according to this preferred embodiment, the first electrode is preferably a metal plate.

In the infrared sensor according to this preferred embodiment, a main component of the material with the low thermal conductivity is at least one of glass, ceramic and resin.

With the method of producing the infrared sensor according to the above-described preferred embodiment of the present invention, since the supporting portions are integrally provided with the base, the unevenness of the height of the supporting portions is reduced. Accordingly, the variation in temperature change of the space (gap) between the pyroelectric element and the base is reduced, thereby producing an infrared sensor with the stable detection accuracy. In addition, to conductively connect the electrode of the pyroelectric element and the electrode of the base, the predetermined amount of conductive paste is applied so as to be higher than the supporting portions, and then the pyroelectric element is mounted on the upper surfaces of the supporting portions. Accordingly, the unevenness of the contact area of the conductive paste with respect to the pyroelectric element is reduced. Thus, the unevenness of the thermal conductivity between the pyroelectric element and the supporting portions is reduced, thereby producing the infrared sensor with the stable detection accuracy.

For applying the predetermined amount of conductive paste on the first electrode as described above, the following conditions are preferably satisfied:

(a) applying the conductive paste on the first electrode by a substantially equivalent amount;

(b) applying the conductive paste on the first electrode so that area in which the conductive paste is applied is substantially equivalent;

(c) controlling the conductive paste applied on the first electrode so as to be higher than the supporting portions by a certain degree or more; and (d) reducing variation in viscosity and fluidity of the conductive paste.

As the above conditions are satisfied, the variation in the contact area of the cured conductive paste with respect to the pyroelectric element is more reliably reduced, thereby providing the infrared sensor with high detection accuracy.

In the structure of the above-described preferred embodiment, passages for the heat radiated by the pyroelectric element upon the reception of the light includes a passage connected to the electrode of the base through the cured conductive paste (hereinafter, referred to as "conductive paste"). Typically, the electrode of the base is formed by plating. A plating film is thinner than the metal plate, thereby providing low thermal conductivity. When the electrode of the base in the passage includes the plating film with the low thermal conductivity, even if the thermal conductivity is uneven between the pyroelectric element and the cured conductive paste, the unevenness does not cause a serious problem since a portion between the conductive paste and the plating film functions as a rate-controlling portion.

In contrast, the metal plate is thicker than the plating film, thereby providing high thermal conductivity. Accordingly, when the electrode of the base includes the metal plate with the high thermal conductivity, if the thermal conductivity is uneven between the pyroelectric element and the cured conductive paste, the portion between the cured conductive paste and the metal plate does not function as a rate-controlling portion, thereby not reducing the unevenness. Therefore, using the metal plate may result less stable detection accuracy in view of the pyroelectric element.

However, according to preferred embodiments of the present invention, the second electrode provided on the one of the principal surfaces of the pyroelectric element is conductively connected to the first electrode, through the predetermined amount of cured conductive paste. Accordingly, the contact area of the cured conductive paste with respect to the pyroelectric element becomes more even. Hence, the thermal conductivity between the conductive paste and the pyroelectric element becomes more even.

Therefore, even when the electrode of the base includes the metal plate as in preferred embodiments of the present invention, the high thermal conductivity would not affect the detection accuracy of the sensor.

In addition, in the infrared sensor according to preferred embodiments of the present invention, the supporting portions include the material with low thermal conductivity, such as glass, ceramic or resin. Therefore, the passage through which the heat generated at the pyroelectric element passes may be restricted to the space between the pyroelectric element and the base, and the cured conductive paste connecting the pyroelectric element and the base. Thus, the number of media provided for transmitting the heat generated at the pyroelectric element is not increased, and instead, may be limited, thereby providing further stable detection accuracy of the sensor.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Features of the present invention will be described in details with reference to preferred embodiments of the present invention.

First Preferred Embodiment

A brief explanation will be given for a structure of an infrared sensor according to the first preferred embodiment of the present invention and a method of producing the infrared sensor.

Figure 1:
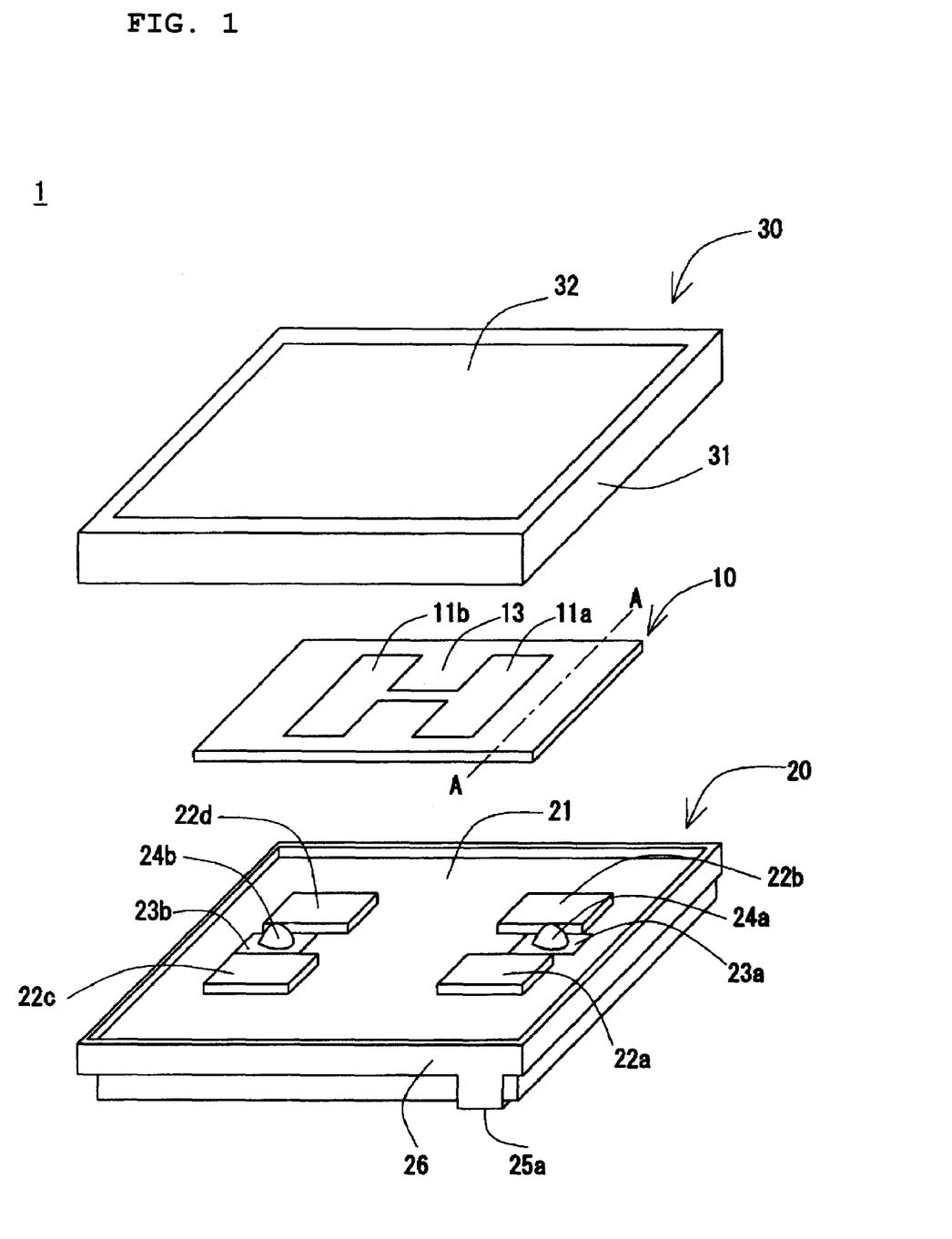
FIG. 1 is an exploded perspective view showing an infrared sensor 1 according to a first preferred embodiment of the present invention.
Figure 2:
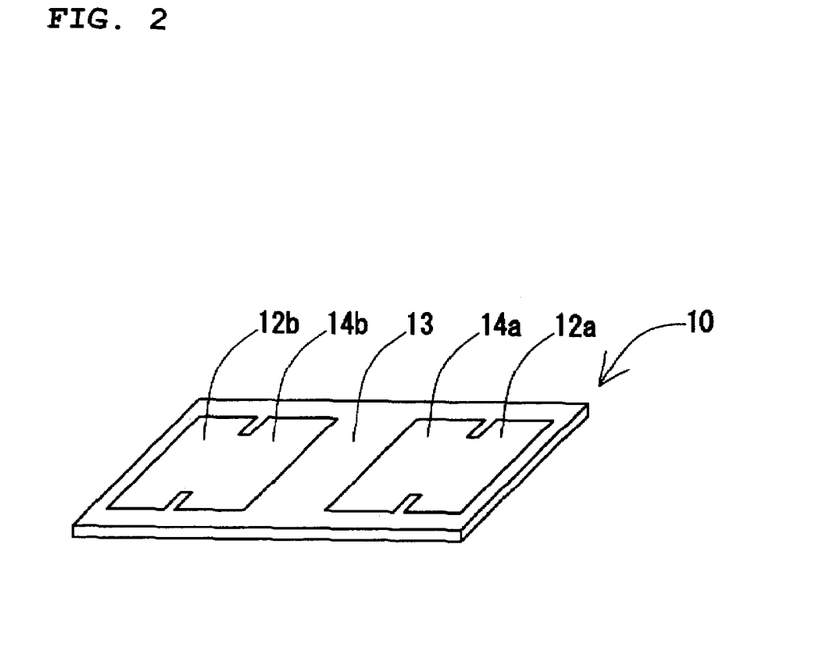
FIG. 2 is a perspective view showing a back surface of a pyroelectric element 10.
Figure 3:
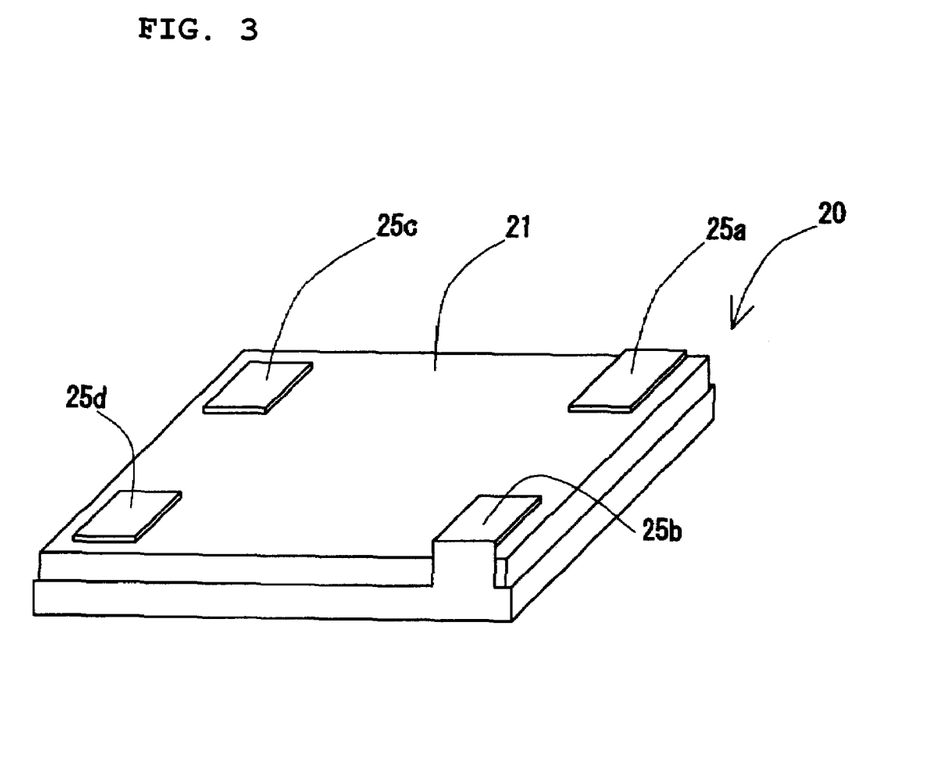
FIG. 3 is a perspective view showing a back surface of a base 20.

FIG. 1 is an exploded perspective view showing an infrared sensor 1 according to this preferred embodiment. The infrared sensor 1 preferably includes a pyroelectric element 10, a base 20, and a case 30. FIG. 2 is a perspective view showing a back surface of the pyroelectric element 10. FIG. 3 is a perspective view showing a back surface of the base 20.

The pyroelectric element 10 includes a ceramic substrate 13 having pyroelectric properties, electrodes 11a and 11b formed as a thin film provided on a front surface of the ceramic substrate 13, electrodes 14a and 14b, and electrodes 12a and 12b, which are second electrodes, the electrodes 14a, 14b, 12a, and 12b being formed as thin films provided on a back surface of the ceramic substrate 13. The electrodes 11a and 11b on the front surface oppose the electrodes 14a and 14b on the back surface. The electrodes 12a and 12b on the back surface are electrodes that are conductible to electrodes which are provided on the base. The electrodes 12a and 12b are connected to the electrodes 14a and 14b on the back surface, respectively.

The base 20 includes a substrate 21 defining a main body that is preferably made of glass. The substrate 21 is integrally formed with four supporting portions 22a to 22d also preferably made of glass. The profile of each of the supporting portions 22a to 22d according to this preferred embodiment is preferably substantially rectangular having a flat upper surface. In this preferred embodiment, the supporting portions 22a to 22d are not formed by the conventional printing. Instead, the supporting portions 22a to 22d are integrally formed with the substrate 21 using a carbon jig. Accordingly, the supporting portions 22a to 22d each have a predetermined height and profile. The supporting portions 22a to 22d are positioned such that four corners of the pyroelectric element 10 are located on the supporting portions 22a to 22d when the pyroelectric element 10 is mounted. Instead of the integral formation, if a method is used in which the supporting portions 22a to 22d and the substrate 21 are separately provided, and then are bonded together, a bonding agent is required. The height of the supporting portions 22a to 22d may be uneven depending on the thickness of the bonding agent. Alternatively, if the separately provided supporting portions 22a to 22d are disposed on the substrate 21 and the vicinities of the mounting surfaces are dissolved and bonded, the height of the supporting portions 22a to 22d may be uneven depending on the dissolved amount.

Electrodes 23a and 23b, which are first electrodes, made from metal plates are provided between the supporting portions 22a and 22b, and between the supporting portions 22c and 22d, respectively, to be exposed at the front surface of the substrate 21. In the formation of the substrate 21 using the above-described carbon jig, the electrodes 23a and 23b are formed by integrally forming a previously molded metal wiring plate 26 with the substrate 21 such that a portion of the wiring plate 26 is exposed at a gap between the supporting portions 22a and 22b, and between the supporting portions 22c and 22d. In the pyroelectric element 10, the electrodes 12a and 12b on the back surface oppose the electrodes 23a and 23b. The electrodes 12a and 12b are conductively connected to the electrodes 23a and 23b, respectively.

Connection electrodes 25a to 25d provided on a back surface of the base 20 are also exposed portions of the above-mentioned metal wiring plate 26, thereby having a SMD structure. The electrode 23a is connected to connection terminals 25a and 25b which are GND electrodes. The electrode 23b is connected to a gate of a FET (not shown). A drain and a source of the FET are connected to the connection electrodes 25c and 25d provided on a back surface of the base 20, respectively.

The case 30 includes a light transmitting window 32 which allows only infrared to pass through it, and a metal frame 31 surrounding the light transmitting window 32. The pyroelectric element 10, the base 20, and the case 30 are assembled to define the infrared sensor 1.

Next, a method of producing an infrared sensor according to preferred embodiments of the present invention will be described in more details with reference FIGS. 4A to 4D, which are procedural cross sectional views.

Figure 4A:
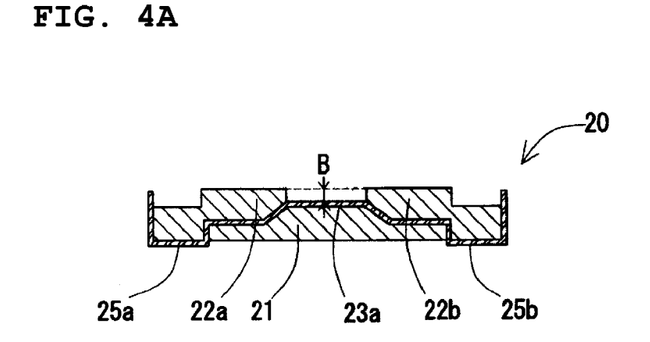
FIGS. 4A to 4D are procedural cross sectional views illustrating each step in a method of producing the infrared sensor 1.

As shown in FIG. 4A, the base 20 is prepared. As described above, the supporting portions 22a and 22b, the electrode 23a made from a metal plate having a thickness of about 100 μm, and the connection electrodes 25a and 25b, are integrally formed with the substrate 21. In the base 20, the supporting portions 22a and 22b are preferably formed so as to bulge from the substrate 21, and the electrode 23a is preferably formed so as to be exposed at the gap between the supporting portions 22a and 22b at the front surface of the substrate 21. Upon the integral formation, a height B of each of the supporting portions 22a and 22b constitutes a predetermined height.

Figure 4B:
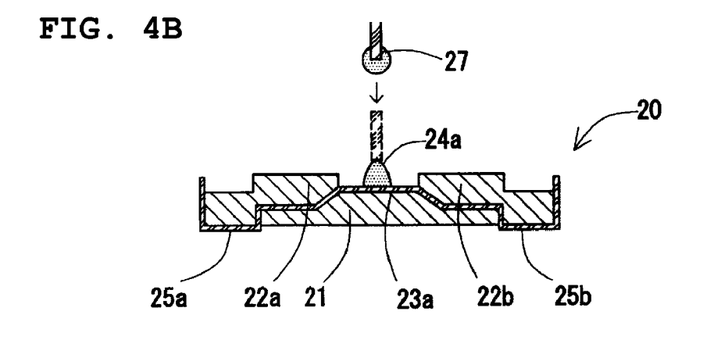

Then, as shown in FIG. 4B, a predetermined amount of conductive paste 24a is applied to a pin 27, and transferred onto the surface of the electrode 23a. At this time, the amount and viscosity of the paste is controlled so that the upper portion of the conductive paste 24a is higher than the supporting portions 22a and 22b.

Figure 4C:
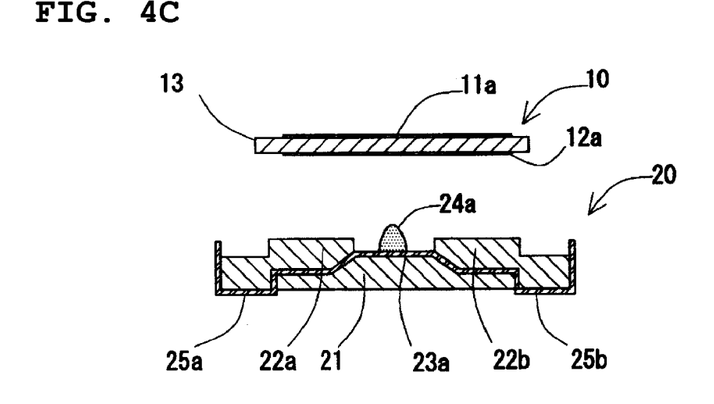
Figure 4D:
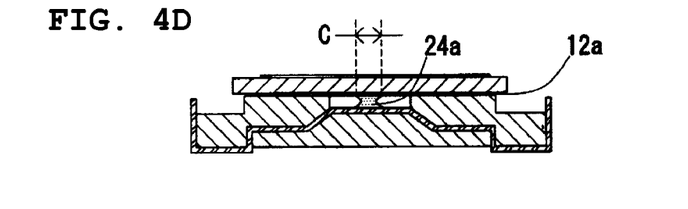

Then, as shown in FIGS. 4C and 4D, the pyroelectric element 10 with the electrode 12a, which is the second electrode, formed on the back surface is mounted on the upper surfaces of the supporting portions 22a and 22b so that the electrode 12a comes into contact with the conductive paste 24a. Since the predetermined amount of conductive paste 24a is applied at the gap between the supporting portions 22a and 22b having the predetermined height so as to be higher than the supporting portions 22a and 22b and the pyroelectric element 10 is mounted under this condition, a bonded area C of the conductive paste 24a with respect to the electrode 12a becomes substantially a predetermined size.

Then, the conductive paste 24a is cured, and the pyroelectric element 10 and the base 20 are bonded (not shown).

As described above, since the height B between the pyroelectric element 10 and the base 20 is the predetermined size, the dimension of the space between the pyroelectric element 10 and the base 20 is even, and thus, the variations in temperature change of the space are reduced. In addition, since the bonded area C of the cured conductive paste 24a with respect to the pyroelectric element 10 has the predetermined size, unevenness in heat quantity transmitted to the base 20 from the pyroelectric element 10 is reduced. Accordingly, the infrared sensor provides stable detection accuracy.

In particular, the infrared sensor according to preferred embodiments of the present invention is effective when the electrode 23a of the base 20 includes the metal plate.

In the structure according to preferred embodiments of the present invention, passages for the heat generated at the pyroelectric element 10 include a passage connected to the electrode 23a of the base through the cured conductive paste 24a.

Typically, the electrode of the base is formed by plating. A plating film is about 10 μm, which is thinner than the metal plate, thereby providing low thermal conductivity. When the electrode of the base in the above-described passage includes the plating film with the low thermal conductivity, even if the thermal conductivity is uneven between the pyroelectric element and the cured conductive paste, the unevenness does not cause a serious problem, since a portion between the cured conductive paste and the plating film functions as a rate-controlling portion.

On the other hand, in this preferred embodiment, the electrode 23a of the base includes the metal plate. The metal plate is about 100 μm in thickness, which is thicker than the plating film, thereby providing high thermal conductivity. Accordingly, if the thermal conductivity is uneven between the pyroelectric element 10 and the cured conductive paste 24a, the portion between the cured conductive paste 24a and the electrode 23a of the metal plate would not function as the rate-controlling portion, thereby failing to reduce the unevenness. Using the metal plate may cause the heat generated at the pyroelectric element 10 to be radiated outside without the heat being confined therein in view of the pyroelectric element 10, thereby contributing less to the stable detection accuracy.

However, according to preferred embodiments of the present invention as shown in FIGS. 4A to 4D, the electrode 12 (second electrode) provided on one of the principal surfaces (back surface) of the pyroelectric element 10 is conductively connected to the electrode 23a (first electrode) of the base, through the predetermined amount of cured conductive paste 24a. Accordingly, the contact area of the cured conductive paste 24a with respect to the pyroelectric element 10 is more even. Thus, the thermal conductivity between the pyroelectric element 10 and the cured conductive paste 24a is more even. Therefore, even when the electrode 23a of the base includes the metal plate, the high thermal conductivity would not substantially degrade the detection accuracy of the sensor.

In a method of producing an infrared sensor according to preferred embodiments of the present invention, it is desirable to meet the following conditions for applying the predetermined amount of conductive pastes 24a and 24b on the upper surfaces of the electrodes 23a and 23b (first electrodes) of the base. The conditions include:

(a) applying the conductive pastes 24a and 24b on the electrodes 23a and 23b (first electrodes) of the base by a substantially equivalent amount;

(b) applying the conductive pastes 24a and 24b on the electrodes 23a and 23b (first electrodes) of the base so that areas in which the conductive pastes 24a and 24b are applied are substantially equivalent;

(c) controlling the conductive pastes 24a and 24b applied on the electrodes 23a and 23b (first electrodes) of the base so as to be higher than the supporting portions 22a to 22d by at least a desired degree; and (d) reducing variation in viscosity and fluidity of the conductive pastes 24a and 24b.

When the above-described conditions are satisfied, the variations in contact areas of the cured conductive pastes with respect to the pyroelectric element are reduced more reliably, thereby providing the infrared sensor with high detection accuracy.

Second Preferred Embodiment

Figure 5:
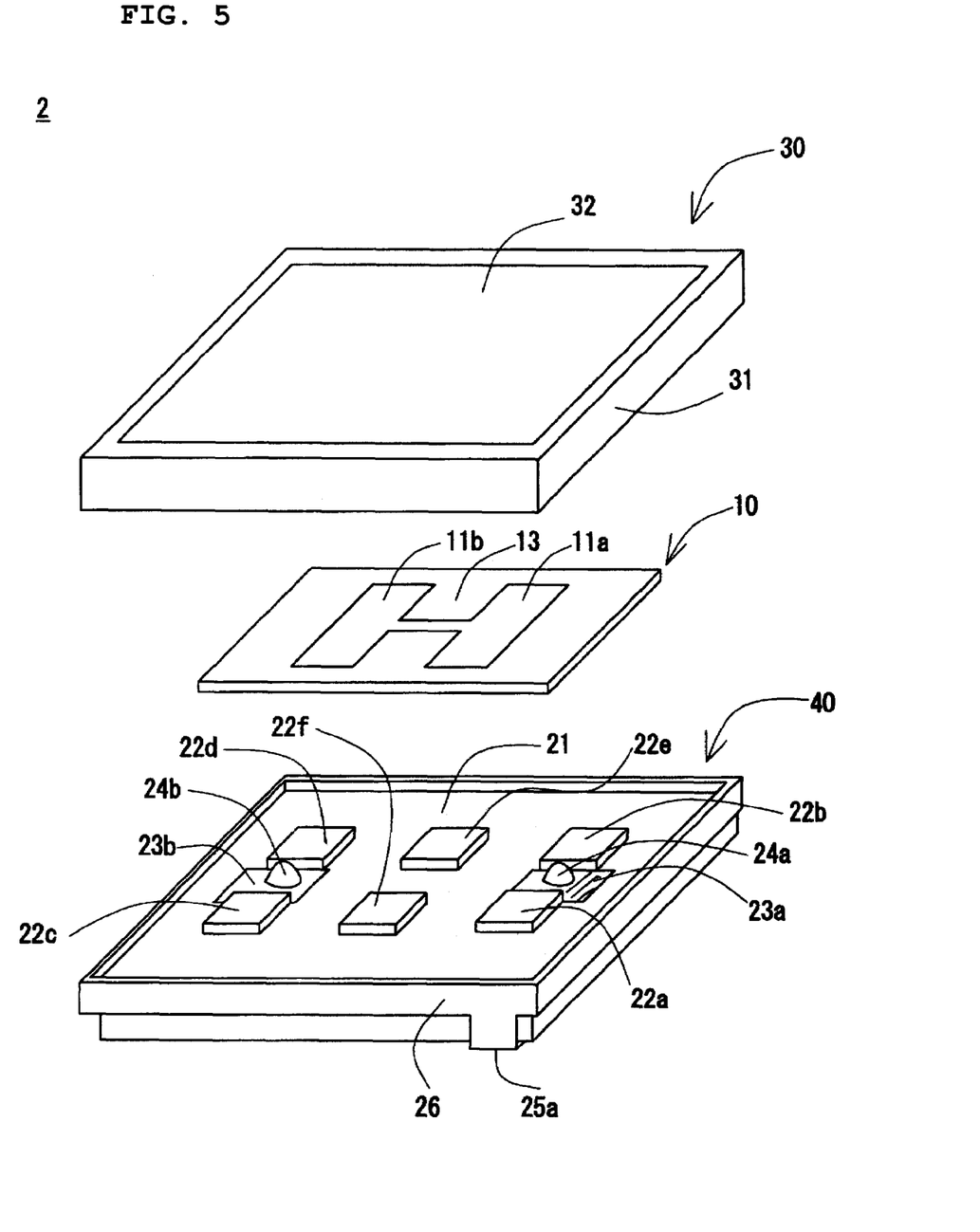
FIG. 5 is an exploded perspective view showing an infrared sensor 2 according to a second preferred embodiment of the present invention.

FIG. 5 is an exploded perspective view showing an infrared sensor 2 according to this preferred embodiment. The infrared sensor 2 is different from the infrared sensor 1 according to the first preferred embodiment in the number of supporting portions.

The four supporting portions are integrally formed with the base 20 of the infrared sensor 1 according to the first preferred embodiment. In contrast, in a base 40 of the infrared sensor 2 according to this preferred embodiment, two supporting portions 22e and 22f are added to the supporting portions of the first preferred embodiment.

Even if the number of supporting portions increases to enhance the retaining strength of the pyroelectric element 10, for example, the advantages of the present invention are not degraded. The present invention is not restricted to any specific number of supporting portions.

Third Preferred Embodiment

Figure 6:
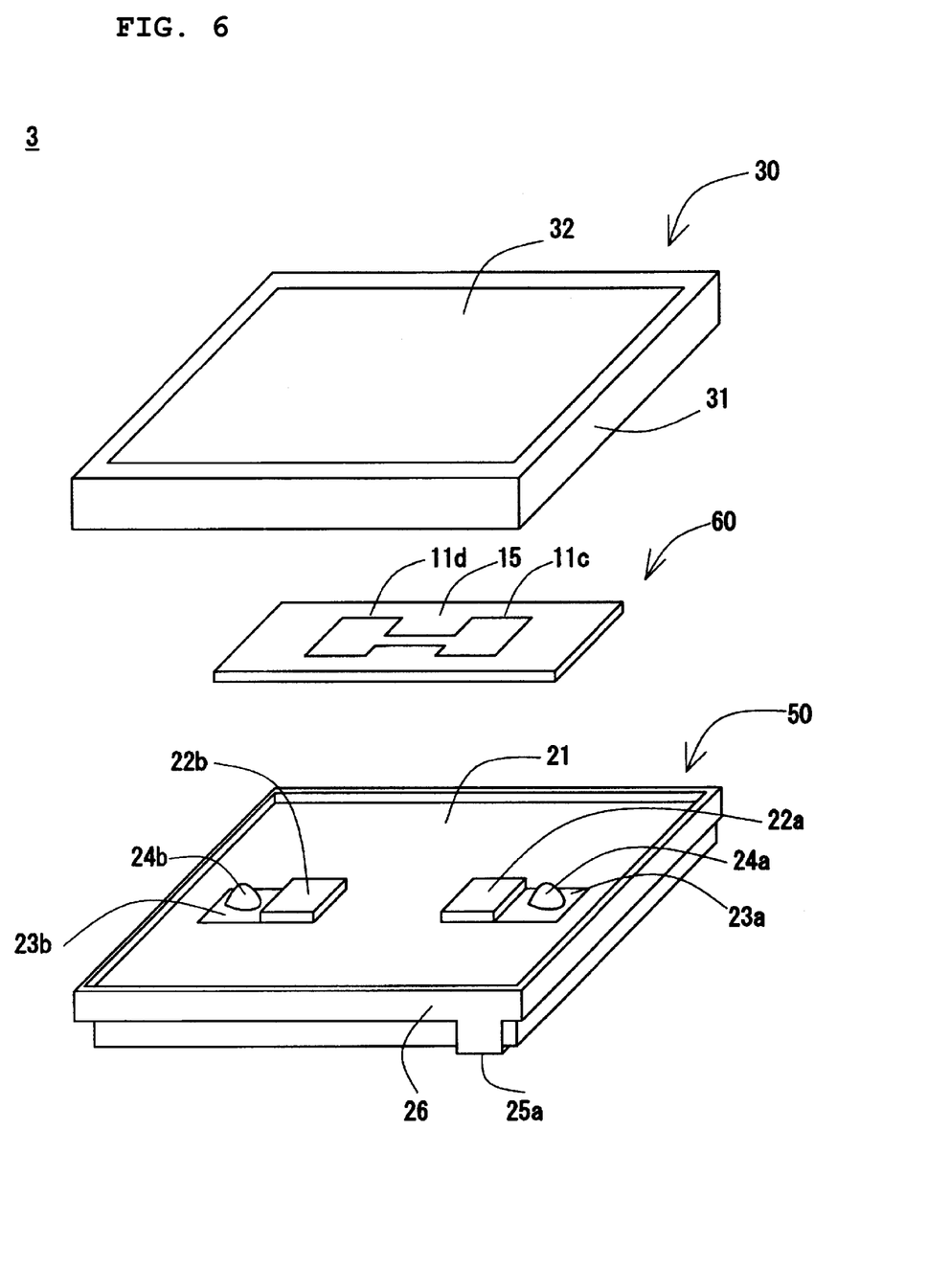
FIG. 6 is an exploded perspective view showing an infrared sensor 3 according to a third preferred embodiment of the present invention.

FIG. 6 is an exploded perspective view showing an infrared sensor 3 according to this preferred embodiment. The infrared sensor 3 is different from the infrared sensor 1 according to the first preferred embodiment in the number of supporting portions, a positional relationship between the supporting portions and the first electrodes, and the profile of the pyroelectric element.

The profile of a pyroelectric element 60 of the infrared sensor 3 according to this preferred embodiment is narrow and long as compared to the pyroelectric element 10 according to the first preferred embodiment. Electrodes 11c and 11d are formed as a thin film provided on a front surface of the ceramic substrate 15 of the pyroelectric element 60. In the base 50 of the infrared sensor 1 of the first preferred embodiment, the four supporting portions are provided at the four corners of the substrate 21, the first electrode is provided between each pair of the supporting portions, and the conductive paste is applied on the first electrode. In contrast, in a base 50 of the infrared sensor 3 according to this preferred embodiment, the supporting portions 22a and 22b are provided at left and right portions of the substrate 21, and the conductive pastes 24a and 24b are applied outside the supporting portions 22a and 22b in an extension connecting the supporting portions 22a and 22b.

When the profile of the pyroelectric element is narrow and long as in this preferred embodiment, the four-point support may not be necessary as in the first preferred embodiment, and the two-point support may be sufficient. In this case, even if the electrodes 23a and 23b, which are first electrodes, are applied outside the supporting portions 22a and 22b, and the conductive pastes 24a and 24b are applied on the electrodes as in this preferred embodiment, the advantages of the present invention are not degraded. Alternatively, the electrodes 23a and 23b, which are first electrodes, may be disposed inside the supporting portions 22a and 22b. The present invention is not restricted to any specific number of supporting portions, or any specific positional relationship between the supporting portions and the first electrodes.

While each supporting portion is preferably made of glass in the above-described preferred embodiments, ceramic or resin may be used. Either of the ceramic and resin has low thermal conductivity. Therefore, a passage through which the heat generated at the pyroelectric element passes may be restricted to the space between the pyroelectric element and the base, and the conductive paste connecting the pyroelectric element and the base.

The base and the supporting portion may be a combination of different materials. For example, the base may be ceramic, and the supporting portion may be glass.

While the profile of each supporting portion is preferably substantially rectangular in the above-described preferred embodiments, the profile may be annular. Also the upper surface of the supporting portion may not be flat, and instead, may protrude in the shape of a cone.

While the structure of the mounting surface of the infrared sensor preferably uses the SMD structure in the above-described preferred embodiments, the present invention may also be applied to a three-terminal type structure.

While a dual type, in which the backside electrode is split into two portions, is illustrated in the above-described preferred embodiments, the present invention may also be applied to a multi-element type in which the backside electrode is split into tree or more portions.

According to preferred embodiments of the present invention, it is possible to provide a small infrared sensor with high detection accuracy and which is capable of being mounted in a small set product, such as wireless equipment, without its structure or its procedural steps being complicated.

Therefore, the present invention may be widely applied to the fields related to infrared sensors used for small set products, such as wireless equipment, and procedural technology of the infrared sensors.

Also, the present invention may be applied to general purpose infrared sensors used for human detection, security apparatuses, and other suitable purposes.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An infrared sensor comprising:
   a base in which a first electrode and a plurality of supporting portions having a predetermined height are provided on a first principal surface of the base;
   a pyroelectric element mounted on upper surfaces of the supporting portions; and
   a connection electrode provided on a second principal surface of the base that is opposite to the first principal surface of the base; wherein
   the supporting portions, the first electrode, and the connection electrode are integrally provided with the base;
   a second electrode is provided on a principal surface of the pyroelectric element;
   the second electrode opposes the first electrode, and is conductively connected to the first electrode via a predetermined amount of cured conductive paste; the supporting portions are made of a material having a main component of at least one of glass, ceramic and resin;
   the supporting portions and the base are made of the same material;
   the first electrode is a metal plate; and
   the first electrode is electrically connected to the connection electrode.

2. The infrared sensor according to claim 1, wherein the plurality of supporting portions includes four supporting portions disposed at corners of the base.

3. The infrared sensor according to claim 1, wherein the plurality of supporting portions includes six supporting portions.

4. The infrared sensor according to claim 1, wherein the plurality of supporting portions includes two supporting portions disposed along opposed sides of the base.

5. The infrared sensor according to claim 1, wherein a passage through which heat generated at the pyroelectric element passes is restricted to the space between the pyroelectric element and the base and the cured conductive paste connecting the pyroelectric element and the base.

6. The infrared sensor according to claim 1, wherein the supporting portions include a flat upper surface.

7. The infrared sensor according to claim 1, wherein the first electrode has a thickness of about 100 μm.

* * * * *